US012813060B2

(12) United States Patent
Adachi et al.

(10) Patent No.: US 12,813,060 B2
(45) Date of Patent: Nov. 24, 2026

(54) DISPLAY DEVICE HAVING FLATTENED LAYER FOR REDUCING LUMINANCE UNEVENNESS

(71) Applicant: SHARP KABUSHIKI KAISHA, Sakai City (JP)

(72) Inventors: Kota Adachi, Sakai City (JP); Yasushi Asaoka, Sakai City (JP); Jun Sakuma, Sakai City (JP)

(73) Assignee: SHARP KABUSHIKI KAISHA, Sakai City (JP)

( * ) Notice: Subject to any disclaimer, the term of this patent is extended or adjusted under 35 U.S.C. 154(b) by 374 days.

(21) Appl. No.: 18/578,460

(22) PCT Filed: Sep. 14, 2021

(86) PCT No.: PCT/JP2021/033663
§ 371 (c)(1),
(2) Date: Jan. 11, 2024

(87) PCT Pub. No.: WO2023/042244
PCT Pub. Date: Mar. 23, 2023

(65) Prior Publication Data

US 2025/0194333 A1 Jun. 12, 2025

(51) Int. Cl.

| | |
|---|---|
| ***H10K 50/115*** | (2023.01) |
| ***H05B 33/12*** | (2006.01) |
| ***H05B 33/14*** | (2006.01) |
| ***H10K 50/15*** | (2023.01) |
| ***H10K 50/16*** | (2023.01) |
| ***H10K 85/60*** | (2023.01) |
| ***H10K 101/30*** | (2023.01) |

(52) U.S. Cl.
CPC ......... *H10K 50/115* (2023.02); *H10K 50/157* (2023.02); *H10K 50/167* (2023.02); *H10K 85/615* (2023.02); *H10K 85/633* (2023.02); *H10K 2101/30* (2023.02)

(58) Field of Classification Search
CPC ...... H05B 33/14; H05B 33/12; H10K 50/115; H10K 50/157; H10K 50/167; H10K 85/615; H10K 85/633; H10K 2101/30
See application file for complete search history.

(56) References Cited

U.S. PATENT DOCUMENTS

| | | | | |
|---|---|---|---|---|
| 11,329,242 | B2 * | 5/2022 | Moon | H10K 59/38 |
| 2019/0288225 | A1 | 9/2019 | Chen et al. | |
| 2019/0326539 | A1 | 10/2019 | Chung et al. | |

(Continued)

FOREIGN PATENT DOCUMENTS

| | | | | |
|---|---|---|---|---|
| CN | 112151689 A | * 12/2020 | | H10K 50/166 |
| JP | 2019-165006 A | 9/2019 | | |
| WO | 2021/100104 A1 | 5/2021 | | |

*Primary Examiner* — Sonya McCall-Shepard
(74) *Attorney, Agent, or Firm* — ScienBiziP, P.C.

(57) ABSTRACT

A display device includes a first electrode, a second electrode facing the first electrode, and a light-emitting layer provided between the first electrode and the second electrode. The light-emitting layer includes a first light-emitting layer including first quantum dots and being provided on a side of the first electrode, a second light-emitting layer including second quantum dots and being provided on a side of the second electrode, and a flattened layer provided between the first light-emitting layer and the second light-emitting layer.

17 Claims, 4 Drawing Sheets

(56) References Cited

U.S. PATENT DOCUMENTS

| | | | | |
|---|---|---|---|---|
| 2021/0159437 | A1* | 5/2021 | Kristal ................. | H10K 50/115 |
| 2021/0226172 | A1 | 7/2021 | Chung et al. | |
| 2022/0416186 | A1 | 12/2022 | Takenaka | |

* cited by examiner

DISPLAY DEVICE HAVING FLATTENED LAYER FOR REDUCING LUMINANCE UNEVENNESS

TECHNICAL FIELD

The disclosure relates to a display device.

BACKGROUND ART

For example, PTL 1 discloses a display device including a first electrode, a hole transport layer placed on the first electrode, a first light-emitting layer placed on the hole transport layer and containing quantum dots, a second light-emitting layer placed on the first light-emitting layer and containing quantum dots, an electron transport layer placed on the second light-emitting layer, and a second electrode placed on the electron transport layer.

CITATION LIST

Patent Literature

PTL 1: JP 2019-165006 A

SUMMARY

Technical Problem

However, when the first light-emitting layer and the second light-emitting layer in PTL 1 are layered and, for example, the first light-emitting layer is very uneven, a boundary between the first light-emitting layer and the second light-emitting layer is unclear, so that the film thickness of the first light-emitting layer and the second light-emitting layer is likely to be nonuniform, and luminance unevenness may occur in the display device.

Thus, a main object of the disclosure is to provide a display device having less luminance unevenness.

Solution to Problem

A display device according to an embodiment of the disclosure includes a first electrode, a second electrode facing the first electrode, and a light-emitting layer provided between the first electrode and the second electrode, and the light-emitting layer includes a first light-emitting layer including first quantum dots and being provided on a side of the first electrode, a second light-emitting layer including second quantum dots and being provided on a side of the second electrode, and a flattened layer provided between the first light-emitting layer and the second light-emitting layer.

DESCRIPTION OF EMBODIMENTS

Figure 1:
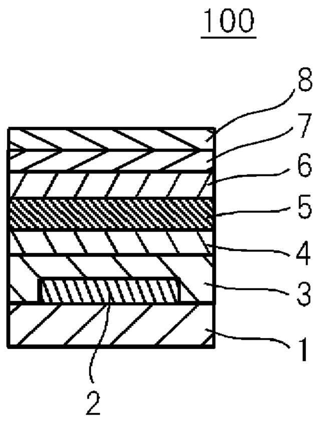
FIG. 1 is a diagram schematically illustrating an example of a layered structure of a display device according to a first embodiment.

With reference to the drawings, embodiments of the disclosure will be described below. Note that, in the drawings, identical or equivalent elements are given an identical reference sign, and redundant descriptions thereof may be omitted. The embodiments described below are merely illustrative of the disclosure. Further, the disclosure is not limited in any way to the following embodiments.

First Embodiment

FIG. 1 is a diagram schematically illustrating an example of a layered structure of a display device 100 according to the present embodiment.

The display device 100 is a device that emits light. For example, the display device 100 may be an illumination device (for example, a backlight or the like) that emits light such as white light, or may be a display device that emits light to display an image (including character information and the like, for example). The display device 100 can be formed, for example, by arraying a plurality of light-emitting elements.

For example, as illustrated in FIG. 1, the display device 100 has a structure in which a first electrode 2, a first charge transport layer 3, a first light-emitting layer 4, a flattened layer 5, a second light-emitting layer 6, a second charge transport layer 7, and a second electrode 8 are layered on a substrate 1 in this order.

The substrate 1 is made of, for example, glass, and functions as a support body that supports each of the layers described above. The substrate 1 may be, for example, an array substrate on which a thin film transistor (TFT) and the like are formed.

The first electrode 2 is disposed on the substrate 1. The first electrode 2 supplies, for example, a first charge to the first light-emitting layer 4 and the second light-emitting layer 6.

The first electrode 2 can be formed using any of various known methods of the related art, for example, sputtering or a vacuum vapor deposition technique.

The first charge transport layer 3 is disposed on the first electrode 2. The first charge injected from the first electrode 2 is transported via the first charge transport layer 3 to the first light-emitting layer 4 and the second light-emitting layer 6. Note that the first charge transport layer 3 may be composed of a single layer or multiple layers.

The first charge transport layer 3 can be formed using any of various known methods of the related art, for example, vacuum vapor deposition, sputtering, or an application method.

The first light-emitting layer 4 is disposed on the first charge transport layer 3. The first light-emitting layer 4 includes first quantum dots forming quantum dots. The first light-emitting layer 4 can be formed using any of various known methods of the related art, for example, an application method. The first light-emitting layer 4 preferably has a thickness from 1 nm to 100 nm.

For example, quantum dots are semiconductor fine particles that have a particle size of 100 nm or less and emit light, and can include a group II-VI semiconductor compound such as MgS, MgSe, MgTe, CaS, CaSe, CaTe, SrS, SrSe, SrTe, BaS, BaSe, BaTe, ZnS, ZnSe, ZnTe, CdS, CdSe, CdTe, HgS, HgSe, and HgTe, and/or a crystal of a group III-V semiconductor compound such as GaAs, GaP, InN, InAs, InP, and InSb, and/or a crystal of a group IV semiconductor compound such as Si and Ge. Furthermore, quantum dots may have, for example, a core/shell structure in which the semiconductor crystal described above is a core and a shell material having a high band gap is coated over the core.

The flattened layer 5 is disposed on the first light-emitting layer 4. For example, the flattened layer 5 flattens the first light-emitting layer 4. In other words, a surface of the flattened layer 5 on a side of the second light-emitting layer 6 is flat. The flattened layer 5 reduces unevenness in the film thickness of the second light-emitting layer 6 to be formed later, and can reduce luminance unevenness in the display device 100.

The flattened layer 5 can be formed using any of various known methods of the related art, for example, an application method. For example, the flattened layer 5 is formed by applying, onto the first light-emitting layer 4, a solution containing a polymer or nanoparticles having a particle diameter smaller than an average particle diameter of the first quantum dots. In the flattened layer 5 formed by the solution, a recessed portion of the surface of the first light-emitting layer 4 is filled with the nanoparticles or the polymer, and the surface of the flattened layer 5 does not have larger unevenness than the surface of the first light-emitting layer 4, so that the first light-emitting layer 4 can be flattened. For example, by using, as the polymer, a material having a size smaller than the average particle diameter of the first quantum dots, it is possible to fill the recessed portion of the surface of the first light-emitting layer 4, and thus obtain a flattening effect. Furthermore, a part of the polymer may be longer than the average particle diameter of the first quantum dots. A shape of the polymer can change when the molecular chain of the polymer rotates. Thus, a part of the molecular chain of the polymer, a portion where the molecular chains of the polymers are entangled with each other, or the like can be fitted into the recessed portion of the surface of the first light-emitting layer 4. Moreover, when only a part of the polymer is longer than the average particle diameter of the first quantum dots, the unevenness in the surface of the flattened layer 5 is not likely to be larger than the unevenness in the surface of the first light-emitting layer 4. As a result, the first light-emitting layer 4 can be flattened.

The film thickness of the flattened layer 5 is preferably equal to or greater than the average particle diameter of the first quantum dots. Thus, the surface of the flattened layer 5 on the side of the second light-emitting layer 6 can be formed into a flatter surface.

Examples of the material of the flattened layer 5 include PFN-DOF, F8T2, Spiro-TAD, and α-NPD represented by the following formulas.

[Chem. 1]

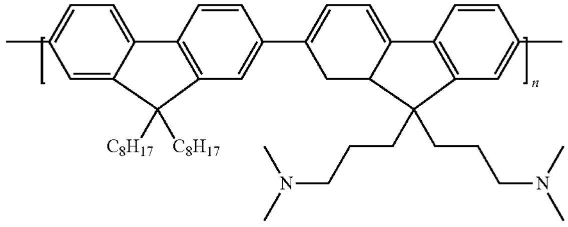

PFN-DOF

-continued

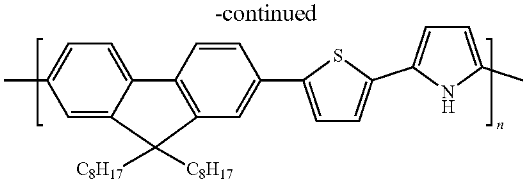

F8T2

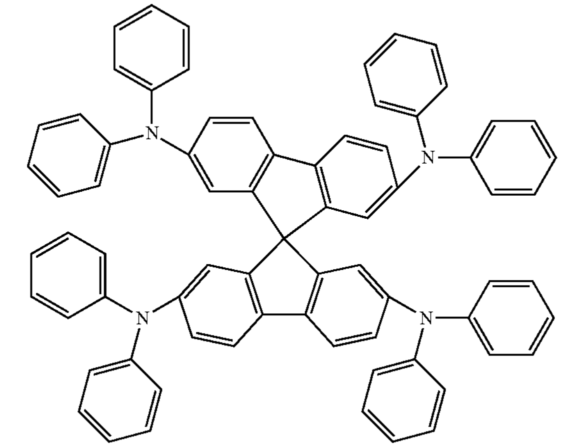

Spiro-TAD

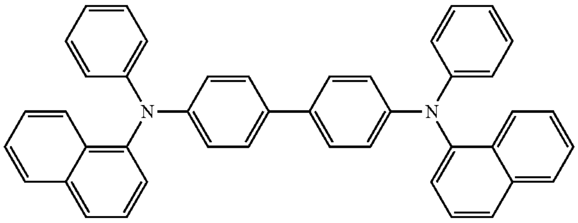

α-NPD

The surface of the flattened layer 5 on the side of the second light-emitting layer 6 preferably satisfies the relationship $\delta_1 > \delta_2$, where $\delta_1$ is the unevenness between the first light-emitting layer 4 and the flattened layer 5 and $\delta_2$ is the unevenness between the flattened layer 5 and the second light-emitting layer 6 in the cross section of the display device 100. For example, $\delta_1$ is represented by $\delta_{t1}-\delta_{b1}$, where $\delta_{b1}$ is the minimum thickness and $\delta_{t1}$ is the maximum thickness of the first light-emitting layer 4. For example, $\delta_2$ is represented by $\delta_{t2}-\delta_{b2}$, where $\delta_{b2}$ is the minimum thickness and $\delta_{t2}$ is the maximum thickness of the flattened layer 5. Thus, when the relationship $\delta_1 > \delta_2$ is satisfied, it can be said that the flattened layer 5 is flat.

In the uneven structure described above, the height of each layer from the substrate is measured by a scanning transmission electron microscope (STEM) to evaluate the unevenness, based on the difference between a peak value that is the maximum value and a valley value that is the minimum value. That is, $\delta_{b1}$ corresponds to a valley value of the first light-emitting layer 4, $\delta_{t1}$ corresponds to a peak value of the first light-emitting layer 4, $\delta_{b2}$ corresponds to a valley value of the flattened layer 5, and $\delta_{t2}$ corresponds to a peak value of the flattened layer 5.

The second light-emitting layer 6 is disposed on the flattened layer 5. The second light-emitting layer 6 includes second quantum dots forming quantum dots. The second light-emitting layer 6 can be formed by using any of various known methods of the related art, for example, an application method. The thickness of the second light-emitting layer 6 is preferably from 1 nm to 100 nm.

Furthermore, the second quantum dots preferably contain a ligand. Examples of the ligand include a polar solvent-dispersed ligand and a non-polar solvent-dispersed ligand. When the ligand is a polar solvent-dispersed ligand, the flattened layer 5 is preferably formed of a non-polar solvent-dispersed material. When the ligand is a non-polar solvent-dispersed ligand, the flattened layer 5 is preferably formed of a polar solvent-dispersed material. Accordingly, when the second light-emitting layer 6 is formed on the flattened layer 5, it is possible to suppress mixing of the flattened layer 5 and the second light-emitting layer 6, and suppress a decrease in the flattening effect of the flattened layer 5.

A layered body of the first light-emitting layer 4, the flattened layer 5, and the second light-emitting layer 6 constitutes a light-emitting layer in the display device 100.

The second charge transport layer 7 is disposed on the second light-emitting layer 6. A second charge injected from the second electrode 8 is transported via the second charge transport layer 7 to the first light-emitting layer 4 and the second light-emitting layer 6. The second charge has opposite polarity to that of the first charge.

Note that the second charge transport layer 7 may be composed of a single layer or multiple layers.

The second charge transport layer 7 can be formed using any of various known methods of the related art, for example, vacuum vapor deposition, sputtering, or an application method.

The second electrode 8 is disposed on the second charge transport layer 7. For example, the second electrode 8 supplies the second charge to the first light-emitting layer 4 and the second light-emitting layer 6.

The second electrode 8 can be formed using any of various known methods of the related art, for example, sputtering or a vacuum vapor deposition technique.

The first electrode 2 and the second electrode 8 are formed of a conductive material, for example, a metal or a transparent conductive oxide. Examples of the metal mentioned above include Al, Cu, Au, and Ag. Examples of the transparent conductive oxide mentioned above include indium tin oxide (ITO), indium zinc oxide (IZO), zinc oxide (ZnO), aluminum zinc oxide (ZnO:Al (AZO)), and boron zinc oxide (ZnO:B (BZO)). Note that the first electrode 2 and the second electrode 8 may be, for example, a layered body including at least one metal layer and/or at least one transparent conductive oxide layer.

Any one of the first electrode 2 and the second electrode 8 is formed of a light-transmissive material. Furthermore, any one of the first electrode 2 and the second electrode 8 may be formed of a light-reflective material. When the display device 100 is a top-emitting display device, the second electrode 8 forming an upper layer is formed of a light-transmissive material, and the first electrode 2 forming a lower layer is formed of a light-reflective material. When the display device 100 is a bottom-emitting display device, the second electrode 8 forming the upper layer is formed of a light-reflective material, and the first electrode 2 forming the lower layer is formed of a light-transmissive material. Furthermore, any one of the first electrode 2 and the second electrode 8 may be a layered body including a light-transmissive material and a light-reflective material, and thus, serve as an electrode having light reflectivity.

A transparent conductive material can be used as the light-transmissive material, for example. Specifically, for example, indium tin oxide (ITO), indium zinc oxide (IZO), tin oxide ($SnO_2$), and fluorine-doped tin oxide (FTO) can be used as the light-transmissive material. These materials have a high transmittance of visible light, and thus, the luminous efficiency of the display device 100 is improved.

A metal material can be used as the light-reflective material, for example. Specifically, for example, aluminum (Al), silver (Ag), copper (Cu), and gold (Au) can be used as the light-reflective material. These materials have a high reflectivity with respect to visible light, so that the luminous efficiency is improved.

Each of the first charge transport layer 3 and the second charge transport layer 7 may be a hole transport layer or an electron transport layer. For example, when the first electrode 2 is an anode and the second electrode 8 is a cathode, the first charge is a positive hole, the second charge is an electron, the first charge transport layer 3 is a hole transport layer, and the second charge transport layer 7 is an electron transport layer. Furthermore, for example, when the first electrode 2 is a cathode and the second electrode 8 is an anode, the first charge is an electron, the second charge is a positive hole, the first charge transport layer 3 is an electron transport layer, and the second charge transport layer 7 is a hole transport layer. For example, the hole transport layer and the electron transport layer may be single-layered or multilayered. When the hole transport layer includes multiple layers, an example thereof is a layered structure including, on a side nearest to the anode, a layer having positive hole injectability. When the electron transport layer includes multiple layers, an example thereof is a layered structure including, on a side nearest to the cathode, a layer having electron injectability.

Examples of a material forming the hole transport layer include materials containing one or more types selected from the group consisting of oxides, nitrides, and carbides containing at least one of Zn, Cr, Ni, Ti, Nb, Al, Si, Mg, Ta, Hf, Zr, Y, La, and Sr; materials such as 4,4',4"-tris(9-carbazolyl)triphenylamine (TCTA), 4,4'-bis[N-(1-naphthyl)-N-phenyl-amino]-biphenyl (NPB), zinc phthalocyanine (ZnPC), di[4-(N,N-ditolylamino)phenyl]cyclohexane (TAPC), 4,4'-bis(carbazol-9-yl)biphenyl (CBP), 2,3,6,7,10,11-hexacyano-1,4,5,8,9,12-hexaazatriphenylene (HATCN), and $MoO_3$; and organic hole transport materials such as poly(N-vinylcarbazole) (PVK), poly(2,7-(9,9-di-n-octylfluorene)-(1,4-phenylene-((4-sec-butylphenyl)imino)-1,4-phenylene (TFB), poly(triphenylamine) derivatives (Poly-TPD), and poly(3,4-ethylenedioxythiophene)/poly(4-styrenesulfonate) (PEDOT:PSS). Only one type of these hole transport materials may be used, or two or more types thereof may be appropriately mixed and used.

As materials forming the electron transport layer, electron transport materials, for example, zinc oxide (e.g., ZnO), titanium oxide (e.g., $TiO_2$), and strontium titanium oxide (e.g., $SrTiO_3$) are used. Only one type of these electron transport materials may be used, or two or more types thereof may be appropriately mixed and used.

The materials forming the hole transport layer and the electron transport layer are appropriately selected in accordance with the configuration and characteristics of the display device 100.

The light emitted from the display device 100 changes depending on the combination of the first quantum dots and the second quantum dots. For example, by using, as the first quantum dots and the second quantum dots, quantum dots that emit light at a plurality of wavelengths, the display device 100 can be a white light display device. Furthermore, by using, as the first quantum dots and the second quantum dots, quantum dots that emit light of the same color, the display device 100 can be a display device that emits monochromatic light.

In the display device 100 described above, it is preferable to eliminate imbalance of carriers between positive holes and electrons in the first charge transport layer 3, the first light-emitting layer 4, the flattened layer 5, the second light-emitting layer 6, and the second charge transport layer 7.

For example, when the first electrode 2 is a cathode, the first charge transport layer 3 is an electron transport layer, the second charge transport layer 7 is a hole transport layer, and the second electrode 8 is an anode, the relationship of expressions (1) below is preferably satisfied, $$a1 \geq b1 \text{ and } e1 \geq f1 \quad (1)$$

where a1 is a difference obtained by subtracting the lowest unoccupied molecular orbital (LUMO) energy level of the second light-emitting layer 6 from the LUMO energy level of the hole transport layer forming the second charge transport layer 7, b1 is a difference obtained by subtracting the LUMO energy level of the first light-emitting layer 4 from the LUMO energy level of the flattened layer 5, e1 is a difference obtained by subtracting the LUMO energy level of the electron transport layer forming the first charge transport layer 3 from the LUMO energy level of the first light-emitting layer 4, and f1 is a value obtained by subtracting the LUMO energy level of the flattened layer 5 from the LUMO energy level of the second light-emitting layer 6.

If the relationship of the expressions (1) mentioned above is satisfied, the luminous efficiency of the display device 100 can be increased.

Furthermore, the relationship of expressions (2) below is preferably satisfied, $$c1 \geq d1 \text{ and } g1 \geq h1 \quad (2)$$

where c1 is a value obtained by subtracting the highest occupied molecular orbital (HOMO) energy level of the electron transport layer forming the first charge transport layer 3 from the HOMO energy level of the first light-emitting layer 4, d1 is a value obtained by subtracting the HOMO energy level of the flattened layer 5 from the HOMO energy level of the second light-emitting layer 6, g1 is a value obtained by subtracting the HOMO energy level of the second light-emitting layer 6 from the HOMO energy level of the hole transport layer forming the second charge transport layer 7, and h1 is a value obtained by subtracting the HOMO energy level of the first light-emitting layer 4 from the HOMO energy level of the flattened layer 5.

If the relationship of the expressions (2) mentioned above is satisfied, the luminous efficiency of the display device 100 can be increased. The energy levels are based on the vacuum level.

An example of a combination of layers satisfying the above-described relationships (1) and (2) is a combination of a layered body of PEDOT:PSS and Poly-TPD from the side of the first electrode 2 as the electron transport layer serving as the first charge transport layer 3, CdSe-based quantum dots as the first quantum dots included in the first light-emitting layer 4, PFN-DOF as the flattened layer 5, InP-based quantum dots as the second quantum dots included in the second light-emitting layer 6, and ZnO as the hole transport layer serving as the second charge transport layer 7.

For example, when the first electrode 2 is an anode, the first charge transport layer 3 is a hole transport layer, the second charge transport layer 7 is an electron transport layer, and the second electrode 8 is a cathode, the relationship of expressions (3) below is preferably satisfied, $$a2 \geq b2 \text{ and } e2 \geq f2 \quad (3)$$

where a2 is a difference obtained by subtracting the LUMO energy level of the second light-emitting layer 6 from the LUMO energy level of the hole transport layer forming the first charge transport layer 3, b2 is a difference obtained by subtracting the LUMO energy level of the first light-emitting layer 4 from the LUMO energy level of the flattened layer 5, e2 is a difference obtained by subtracting the LUMO energy level of the electron transport layer forming the second charge transport layer 7 from the LUMO energy level of the first light-emitting layer 4, and f2 is a value obtained by subtracting the LUMO energy level of the flattened layer 5 from the LUMO energy level of the second light-emitting layer 6.

If the relationship of the expressions (3) mentioned above is satisfied, the luminous efficiency of the display device 100 can be increased.

The relationship of expressions (4) below is preferably satisfied, $$c2 \geq d2 \text{ and } g2 \geq h2 \quad (4)$$

where c2 is a value obtained by subtracting the HOMO energy level of the electron transport layer forming the second charge transport layer 7 from the HOMO energy level of the first light-emitting layer 4, d2 is a value obtained by subtracting the HOMO energy level of the flattened layer 5 from the HOMO energy level of the second light-emitting layer 6, g2 is a value obtained by subtracting the HOMO energy level of the second light-emitting layer 6 from the HOMO energy level of the hole transport layer forming the first charge transport layer 3, and h2 is a value obtained by subtracting the HOMO energy level of the first light-emitting layer 4 from the HOMO energy level of the flattened layer 5.

If the relationship of the expressions (4) mentioned above is satisfied, the luminous efficiency of the display device 100 can be increased.

Second Embodiment

Figure 2:
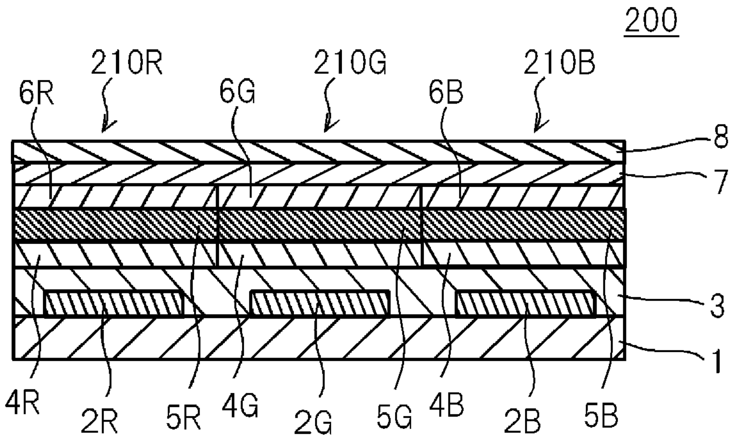
FIG. 2 is a diagram schematically illustrating an example of a layered structure of a display device according to a second embodiment.

FIG. 2 is a diagram schematically illustrating an example of a layered structure of a display device 200 according to the present embodiment.

The display device 200 is a device that emits light. For example, the display device 200 may be an illumination device (for example, a backlight or the like) that emits light such as white light, or may be a display device that emits light to display an image (including character information and the like, for example). In the present embodiment, an example will be described in which the display device 200 is constituted by a plurality of light-emitting elements and each one of the light-emitting elements forms one pixel in the display device. For example, the display device 200 can be formed by arraying a plurality of pixels in a matrix shape.

As illustrated in FIG. 2, the display device 200 includes, for example, a first light-emitting element 210R that emits red light, a second light-emitting element 210G that emits green light, and a third light-emitting element 210B that emits blue light. The first light-emitting element 210R has a light emission central wavelength at a first wavelength and emits light at about 630 nm, for example. The second light-emitting element 210G has a light emission central wavelength at a second wavelength and emits light at about 530 nm, for example. The third light-emitting element 210B has a light emission central wavelength at a third wavelength and emits light at about 440 nm, for example.

The first light-emitting element 210R has a structure in which a first electrode 2R, the first charge transport layer 3, a first light-emitting layer 4R, a flattened layer 5R, a second light-emitting layer 6R, the second charge transport layer 7, and the second electrode 8 are layered on the substrate 1 in this order.

The first electrode 2R is disposed on the substrate 1. For example, the first electrode 2R supplies a first charge to the first light-emitting layer 4R and the second light-emitting layer 6R. The first electrode 2R is electrically connected to a TFT formed on the substrate 1, for example. Note that the first electrode 2R is similar to the first electrode 2 in the first embodiment.

The first charge transport layer 3 is disposed on the first electrode 2R.

The first light-emitting layer 4R is disposed on the first charge transport layer 3. The first light-emitting layer 4R has a light emission central wavelength at the first wavelength and emits light at about 630 nm, for example. The first light-emitting layer 4R includes, for example, first quantum dots that have a light emission central wavelength at the first wavelength and emit light at about 630 nm, for example. Note that the first light-emitting layer 4R is similar to the first light-emitting layer 4 in the first embodiment, for example.

The flattened layer 5R is disposed on the first light-emitting layer 4R. The flattened layer 5R is similar to the flattened layer 5. The flattened layer 5R flattens, for example, the first light-emitting layer 4R. In other words, a surface of the flattened layer 5R on a side of the second light-emitting layer 6R is flat. The flattened layer 5R reduces unevenness in the film thickness of the second light-emitting layer 6R to be formed later, and can reduce luminance unevenness in the first light-emitting element 210R.

The second light-emitting layer 6R is disposed on the flattened layer 5R. The second light-emitting layer 6R has a light emission central wavelength at the first wavelength and emits light at about 630 nm, for example. The second light-emitting layer 6R includes, for example, first second quantum dots that have a light emission central wavelength at the first wavelength and emit light at about 630 nm, for example. The thickness of the second light-emitting layer 6R is preferably from 1 nm to 100 nm. Note that the second light-emitting layer 6R is similar to the second light-emitting layer 6 in the first embodiment, for example. The first second quantum dots may be the same as or different from the first quantum dots.

The second charge transport layer 7 is disposed on the second light-emitting layer 6R.

The second electrode 8 is disposed on the second charge transport layer 7.

Next, the second light-emitting element 210G will be described.

The second light-emitting element 210G has a configuration similar to that of the first light-emitting element 210R. However, the second light-emitting element 210G and the first light-emitting element 210R are different in that the first light-emitting layer 4R is changed to a first light-emitting layer 4G, the flattened layer 5R is changed to a flattened layer 5G, and the second light-emitting layer 6R is changed to a second light-emitting layer 6G. Note that a first electrode 2G is similar to the first electrode 2R.

The first light-emitting layer 4G has a light emission central wavelength at the second wavelength and emits light at 530 nm, for example. The first light-emitting layer 4G includes, for example, second first quantum dots that have a light emission central wavelength at the second wavelength and emit light at about 530 nm, for example.

The second light-emitting layer 6G has a light emission central wavelength at the second wavelength and emits light at 530 nm, for example. The second light-emitting layer 6G includes, for example, second quantum dots that have a light emission central wavelength at the second wavelength and emit light at about 530 nm, for example. The second quantum dots may be the same as or different from the second first quantum dots.

Next, the third light-emitting element 210B will be described.

The third light-emitting element 210B has a configuration similar to that of the first light-emitting element 210R. However, the third light-emitting element 210B and the first light-emitting element 210R are different in that the first light-emitting layer 4R is changed to a first light-emitting layer 4B, and the second light-emitting layer 6R is changed to a second light-emitting layer 6B. Note that a first electrode 2B is similar to the first electrode 2R.

The first light-emitting layer 4B has a light emission central wavelength at the third wavelength and emits light at about 440 nm, for example. For example, the first light-emitting layer 4B includes, for example, third first quantum dots that have a light emission central wavelength at the third wavelength and emit light at about 440 nm, for example.

The second light-emitting layer 6B has a light emission central wavelength at the third wavelength and emits light at about 440 nm, for example. The second light-emitting layer 6B includes, for example, third second quantum dots that have a light emission central wavelength at the third wavelength and emit light at about 440 nm, for example. The third second quantum dots may be the same as or different from the third first quantum dots.

Furthermore, in the display device 200 described above, a bank may be provided so as to isolate the first light-emitting element 210R, the second light-emitting element 210G, and the third light-emitting element 210B of each color. The bank is formed of, for example, a resin having insulating properties such as polyimide and acrylic resins.

The thicknesses of the layers including the light-emitting layers 4R, 4G, 4B, 6R, 6G, and 6B and the flattened layers 5R, 5G, and 5B are not particularly limited and may be the same or different from each other. In each of the light-emitting elements 210R, 210G, and 210B, the total thickness of the light-emitting layer and the flattened layer is not particularly limited, and the total thicknesses may be the same or different from each other.

In the display device 200 described above, in the first light-emitting element 210R, the second light-emitting element 210G, and the third light-emitting element 210B, the flattened layer is formed separately as a respective one of the flattened layers 5R, 5G, and 5B. Thus, optimum materials for the flattened layers 5R, 5G, and 5B can be selected in the first light-emitting element 210R, the second light-emitting element 210G, and the third light-emitting element 210B.

Furthermore, the flattened layers 5R, 5G, and 5B may be formed as a common flattened layer. Therefore, the number of processes can be reduced, compared to a case where the flattened layers 5R, 5G, and 5B are separately formed.

In the display device 200 described above, the first charge transport layer 3, the second charge transport layer 7, and the second electrode 8 are formed as common layers. However, the disclosure is not limited thereto, and the first charge transport layer 3, the second charge transport layer 7, and the second electrode 8 may have configurations formed separately from each other for each light-emitting element of a respective color. Thus, optimum materials for the flattened layers 5R, 5G, and 5B can be better selected in the first light-emitting element 210R, the second light-emitting element 210G, and the third light-emitting element 210B, than in a case where the first charge transport layer 3, the second charge transport layer 7, and the second electrode 8 are formed as common layers. In the first light-emitting element 210R, the second light-emitting element 210G, and the third light-emitting element 210B, the thicknesses of the first charge transport layer 3 and the second charge transport layer 7 are not particularly limited and may be the same or different from each other.

Third Embodiment

Figure 3:
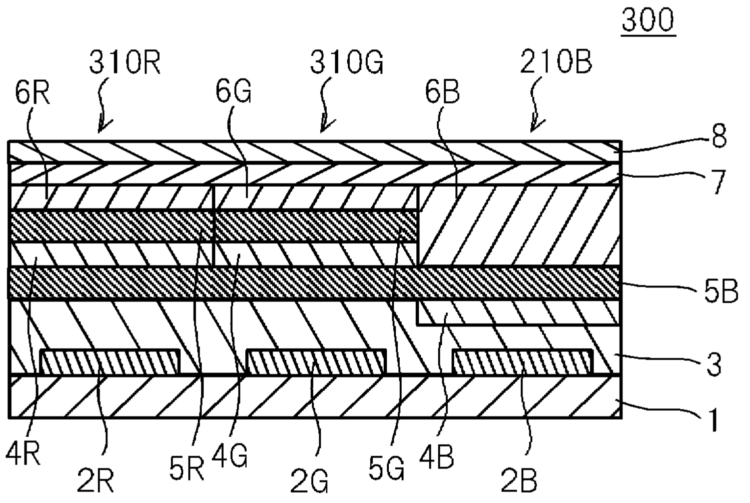
FIG. 3 is a diagram schematically illustrating an example of a layered structure of a display device according to a third embodiment.

FIG. 3 is a diagram schematically illustrating an example of a layered structure of a display device 300 according to the present embodiment.

The display device 300 has a configuration similar to the display device 200. However, the display device 300 and the display device 200 are different in that the first light-emitting element 210R is changed to a first light-emitting element 310R and the second light-emitting element 210G is changed to a second light-emitting element 310G.

Compared to the first light-emitting element 210R according to the second embodiment, the first light-emitting element 310R further includes the flattened layer 5B between the first charge transport layer 3 and the first light-emitting layer 4R. The flattened layer 5B is obtained by elongating the flattened layer 5B in the third light-emitting element 210B. Other parts of the configuration of the first light-emitting element 310R are similar to those of the first light-emitting element 210R.

Compared to the second light-emitting element 210G according to the second embodiment, the second light-emitting element 310G further includes the flattened layer 5B between the first charge transport layer 3 and the first light-emitting layer 4G. The flattened layer 5B is obtained by elongating the flattened layer 5B in the third light-emitting element 210B. Other parts of the configuration of the second light-emitting element 310G are similar to those of the second light-emitting element 210G.

In the first light-emitting element 310R described above, it is preferable to eliminate imbalance of carriers between positive holes and electrons in the first charge transport layer 3, the flattened layer 5B, the first light-emitting layer 4R, the flattened layer 5R, the second light-emitting layer 6R, and the second charge transport layer 7.

For example, when the first electrode 2R is a cathode, the first charge transport layer 3 is an electron transport layer, the second charge transport layer 7 is a hole transport layer, and the second electrode 8 is an anode, the relationship in expression (5) below is preferably satisfied, $$s > t \quad (5)$$

where s is a difference obtained by subtracting the LUMO energy level of the electron transport layer forming the first charge transport layer 3 from the LUMO energy level of the flattened layer 5B, and t is a difference obtained by subtracting the LUMO energy level of the electron transport layer forming the first charge transport layer 3 from the LUMO energy level of the first light-emitting layer 4R.

If the relationship of the expression (5) mentioned above is satisfied, the luminous efficiency of the first light-emitting element 310R can be increased. It is preferable that a similar relationship is satisfied in the second light-emitting element 310G.

In the present embodiment, a configuration in which the flattened layer 5B in the third light-emitting element 210B extends to the first light-emitting element 310R and the second light-emitting element 310G has been described. However, the flattened layer 5R in the first light-emitting element 310R may extend to the second light-emitting element 310G and the third light-emitting element 210B, or the flattened layer 5G in the second light-emitting element 310G may extend to the first light-emitting element 310R and the third light-emitting element 210B.

Fourth Embodiment

Figure 4:
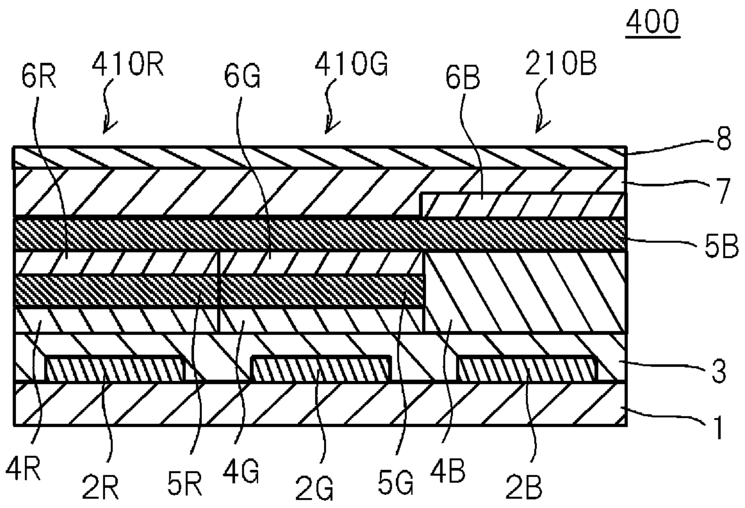
FIG. 4 is a diagram schematically illustrating an example of a layered structure of a display device according to a fourth embodiment.

FIG. 4 is a diagram schematically illustrating an example of a layered structure of a display device 400 according to the present embodiment.

The display device 400 has a configuration similar to that of the display device 200 according to the second embodiment. However, the display device 400 and the display device 200 are different in that the first light-emitting element 210R is changed to a first light-emitting element 410R and the second light-emitting element 210G is changed to a second light-emitting element 410G.

Compared to the first light-emitting element 210R according to the second embodiment, the first light-emitting element 410R further includes the flattened layer 5B between the second light-emitting layer 6R and the second charge transport layer 7. The flattened layer 5B is obtained by elongating the flattened layer 5B in the third light-emitting element 210B. Other parts of the configuration of the first light-emitting element 410R are similar to those of the first light-emitting element 210R.

Compared to the second light-emitting element 210G according to the second embodiment, the second light-emitting element 410G further includes the flattened layer 5B between the second light-emitting layer 6G and the second charge transport layer 7. The flattened layer 5B is obtained by elongating the flattened layer 5B in the third light-emitting element 210B. Other parts of the configuration of the second light-emitting element 410G are similar to those of the second light-emitting element 210G.

In the first light-emitting element 410R described above, it is preferable to eliminate imbalance of carriers between positive holes and electrons in the first charge transport layer 3, the first light-emitting layer 4R, the flattened layer 5R, the second light-emitting layer 6R, the flattened layer 5B, and the second charge transport layer 7.

For example, when the first electrode 2R is a cathode, the first charge transport layer 3 is an electron transport layer, the second charge transport layer 7 is a hole transport layer, and the second electrode 8 is an anode, the relationship of expression (6) below is preferably satisfied, $$x > y > z \quad (6)$$

where x is the HOMO energy level of the hole transport layer forming the second charge transport layer 7, y is the HOMO energy level of the flattened layer 5B, and z is the HOMO energy level of the second light-emitting layer 6R.

If the relationship of the expression (6) mentioned above is satisfied, the luminous efficiency of the first light-emitting element 410R can be increased. It is preferable that a similar relationship is satisfied in the second light-emitting element 410G.

In the present embodiment, a configuration in which the flattened layer 5B in the third light-emitting element 210B extends to the first light-emitting element 410R and the second light-emitting element 410G has been described. However, the flattened layer 5R in the first light-emitting element 410R may extend to the second light-emitting element 410G and the third light-emitting element 210B, or the flattened layer 5G in the second light-emitting element 410G may extend to the first light-emitting element 410R and the third light-emitting element 210B.

The disclosure is not limited to the embodiments described above, and may be replaced with a configuration that is substantially the same as the configuration described in the embodiments described above, a configuration that exerts the same action and effect, or a configuration that can achieve the same object.

The invention claimed is:

1. A display device, comprising:

a first electrode;

a second electrode facing the first electrode; and a light-emitting layer provided between the first electrode and the second electrode, wherein:

the light-emitting layer includes:

a first light-emitting layer including first quantum dots and being provided on a side of the first electrode, a second light-emitting layer including second quantum dots and being provided on a side of the second electrode, and a flattened layer provided between the first light-emitting layer and the second light-emitting layer, an unevenness between the flattened layer and the second light-emitting layer is smaller than an unevenness between the first light-emitting layer and the flattened layer, the first light-emitting layer and the second light-emitting layer have a same light emission center wavelength, a material of the first quantum dots differs from a material of the second quantum dots, and the first light-emitting layer does not include the second quantum dots, and the second light-emitting layer does not include the first quantum dots.

2. The display device according to claim 1, wherein a film thickness of the flattened layer is equal to or greater than an average particle diameter of the first quantum dots.

3. The display device according to claim 1, wherein a surface of the flattened layer on a side of the second light-emitting layer is flat.

4. The display device according to claim 1, wherein the second quantum dots include a polar solvent-dispersed ligand, and the flattened layer is formed of a non-polar solvent-dispersed material.

5. The display device according to claim 1, wherein the second quantum dots include a non-polar solvent-dispersed ligand, and the flattened layer is formed of a polar solvent-dispersed material.

6. The display device according to claim 1, further comprising:

a hole transport layer provided between the first electrode and the first light-emitting layer; and an electron transport layer provided between the second electrode and the second light-emitting layer, wherein:

a relationship of expressions (1) below is satisfied:

$$a1 \geq b1 \text{ and } e1 \geq f1, \quad (1)$$

where:

a1 is a difference obtained by subtracting a lowest unoccupied molecular orbital (LUMO) energy level of the first light-emitting layer from a LUMO energy level of the hole transport layer, b1 is a difference obtained by subtracting a LUMO energy level of the second light-emitting layer from a LUMO energy level of the flattened layer, e1 is a difference obtained by subtracting a LUMO energy level of the electron transport layer from the LUMO energy level of the second light-emitting layer, and f1 is a value obtained by subtracting the LUMO energy level of the flattened layer from the LUMO energy level of the first light-emitting layer.

7. The display device according to claim 1, further comprising:

a hole transport layer provided between the first electrode and the first light-emitting layer; and an electron transport layer provided between the second electrode and the second light-emitting layer, wherein:

a relationship of expressions (2) below is satisfied:

$$c1 \geq d1 \text{ and } g1 \geq h1, \quad (2)$$

where:

c1 is a value obtained by subtracting a highest occupied molecular orbital (HOMO) energy level of the electron transport layer from a HOMO energy level of the second light-emitting layer, d1 is a value obtained by subtracting a HOMO energy level of the flattened layer from a HOMO energy level of the first light-emitting layer, g1 is a value obtained by subtracting the HOMO energy level of the first light-emitting layer from a HOMO energy level of the hole transport layer, and h1 is a value obtained by subtracting the HOMO energy level of the second light-emitting layer from the HOMO energy level of the flattened layer.

8. The display device according to claim 1, further comprising:

an electron transport layer provided between the first electrode and the first light-emitting layer; and a hole transport layer provided between the second electrode and the second light-emitting layer, wherein:

a relationship of expressions (3) below is satisfied:

$$a2 \geq b2 \text{ and } e2 \geq f2, \tag{3}$$

where:

a2 is a difference obtained by subtracting a lowest unoccupied molecular orbital (LUMO) energy level of the second light-emitting layer from a LUMO energy level of the hole transport layer, b2 is a difference obtained by subtracting a LUMO energy level of the first light-emitting layer from a LUMO energy level of the flattened layer, e2 is a difference obtained by subtracting a LUMO energy level of the electron transport layer from the LUMO energy level of the first light-emitting layer, and f2 is a value obtained by subtracting the LUMO energy level of the flattened layer from the LUMO energy level of the second light-emitting layer.

9. The display device according to claim 1, further comprising:

an electron transport layer provided between the first electrode and the first light-emitting layer; and a hole transport layer provided between the second electrode and the second light-emitting layer, wherein:

a relationship of expressions (4) below is satisfied:

$$c2 \geq d2 \text{ and } g2 \geq h2, \tag{4}$$

where:

c2 is a value obtained by subtracting a highest occupied molecular orbital (HOMO) energy level of the electron transport layer from a HOMO energy level of the first light-emitting layer, d2 is a value obtained by subtracting a HOMO energy level of the flattened layer from a HOMO energy level of the second light-emitting layer, g2 is a value obtained by subtracting the HOMO energy level of the second light-emitting layer from a HOMO energy level of the hole transport layer, and h2 is a value obtained by subtracting the HOMO energy level of the first light-emitting layer from the HOMO energy level of the flattened layer.

10. A display device, comprising:

a first light-emitting element having a light emission central wavelength at a first wavelength; and a second light-emitting element having a light emission central wavelength at a second wavelength, different from the first wavelength, wherein:

the first light-emitting element includes:

a first electrode, a second electrode facing the first electrode, and a first light-emitting layer provided between the first electrode and the second electrode, the first light-emitting layer includes:

a first light-emitting layer including first quantum dots and being provided on a side of the first electrode, a second light-emitting layer including second quantum dots and being provided on a side of the second electrode, and a first flattened layer provided between the first light-emitting layer and the second light-emitting layer, the second light-emitting element includes;

a third electrode, a fourth electrode facing the third electrode, and a second light-emitting layer provided between the third electrode and the fourth electrode, the second light-emitting layer includes:

a third light-emitting layer including third quantum dots and being provided on a side of the third electrode, a fourth light-emitting layer including fourth quantum dots and being provided on a side of the fourth electrode, and a second flattened layer provided between the third light-emitting layer and the fourth light-emitting layer, an unevenness between the first flattened layer and the second light-emitting layer is smaller than an unevenness between the first light-emitting layer and the first flattened layer, the first light-emitting layer and the second light-emitting layer have a same light emission center wavelength, a material of the first quantum dots differs from a material of the second quantum dots, the first light-emitting layer does not include the second quantum dots, and the second light-emitting layer does not include the first quantum dots, an unevenness between the second flattened layer and the fourth light-emitting layer is smaller than an unevenness between the third light-emitting layer and the second flattened layer, the third light-emitting layer and the fourth light-emitting layer have a same light emission center wavelength, a material of the third quantum dots differs from a material of the fourth quantum dots, and the third light-emitting layer does not include the fourth quantum dots, and the fourth light-emitting layer does not include the third quantum dots.

11. The display device according to claim 10, wherein the first flattened layer and the second flattened layer are provided in common.

12. The display device according to claim 10, wherein the second flattened layer extends between the first first-electrode and the first light-emitting layer.

13. The display device according to claim 12, further comprising:

an electron transport layer provided between the first electrode and the second flattened layer; and a hole transport layer provided between the second electrode and the second light-emitting layer, wherein;

a relationship of expression (5) below is satisfied:

$$s > t, \quad (5)$$

where:

s is a difference obtained by subtracting a lowest unoccupied molecular orbital (LUMO) energy level of the electron transport layer from a LUMO energy level of the second flattened layer, and t is a difference obtained by subtracting the LUMO energy level of the electron transport layer from a LUMO energy level of the first light-emitting layer.

14. The display device according to claim 10, wherein the second flattened layer extends between the second electrode and the second light-emitting layer.

15. The display device according to claim 14, further comprising:

an electron transport layer provided between the first electrode and the second flattened layer; and a hole transport layer provided between the second electrode and the second light-emitting layer, wherein:

a relationship of expression (6) below is satisfied:

$$x > y > z, \quad (6)$$

where:

x is a highest occupied molecular orbital (HOMO) energy level of the hole transport layer, y is a HOMO energy level of the second flattened layer, and z is a HOMO energy level of the second light-emitting layer.

16. The display device according to claim 1, wherein a highest occupied molecular orbital (HOMO) energy level of the first light-emitting layer differs from a HOMO energy level of the second light-emitting layer, and a lowest unoccupied molecular orbital (LUMO) energy level of the first light-emitting layer differs from a LUMO energy level of the second light-emitting layer.

17. The display device according to claim 10, wherein a highest occupied molecular orbital (HOMO) energy level of the first light-emitting layer differs from a HOMO energy level of the second light-emitting layer, and a lowest unoccupied molecular orbital (LUMO) energy level of the first light-emitting layer differs from a LUMO energy level of the second light-emitting layer, and a HOMO energy level of the third light-emitting layer differs from a HOMO energy level of the fourth light-emitting layer, and a LUMO energy level of the third light-emitting layer differs from a LUMO energy level of the fourth light-emitting layer.

* * * * *